(12) United States Patent
McDaniel et al.

(10) Patent No.: US 8,580,666 B2
(45) Date of Patent: Nov. 12, 2013

(54) METHODS OF FORMING CONDUCTIVE CONTACTS

(75) Inventors: Terrence McDaniel, Boise, ID (US); Sandra Tagg, Boise, ID (US); Fred Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/246,146

(22) Filed: Sep. 27, 2011

(65) Prior Publication Data
US 2012/0025385 A1 Feb. 2, 2012

Related U.S. Application Data

(60) Continuation of application No. 11/512,004, filed on Aug. 29, 2006, now Pat. No. 8,026,542, which is a division of application No. 10/932,327, filed on Sep. 1, 2004, now Pat. No. 7,605,033.

(51) Int. Cl.
| | |
|---|---|
| H01L 21/3205 | (2006.01) |
| H01L 21/8242 | (2006.01) |
| H01L 21/28 | (2006.01) |
| H01L 21/285 | (2006.01) |
| H01L 21/768 | (2006.01) |
| H01L 27/108 | (2006.01) |

(52) U.S. Cl.
CPC ...... *H01L 21/28052* (2013.01); *H01L 21/2855* (2013.01); *H01L 21/76846* (2013.01); *H01L 21/76895* (2013.01); *H01L 27/10888* (2013.01); *H01L 27/10894* (2013.01)
USPC ............ 438/586; 438/210; 438/655; 438/683

(58) Field of Classification Search
CPC ...................... H01L 21/28052; H01L 21/2855; H01L 21/76846; H01L 21/76895; H01L 27/10888; H01L 27/10894
USPC .................................. 438/586, 655, 683, 210
See application file for complete search history.

(56) References Cited

U.S. PATENT DOCUMENTS

| | | | |
|---|---|---|---|
| 6,103,637 | A | 8/2000 | Torek et al. |
| 6,150,689 | A | 11/2000 | Narui et al. |
| 6,235,145 | B1 | 5/2001 | Li et al. |
| 6,235,620 | B1 | 5/2001 | Saito et al. |
| 6,258,709 | B1 | 7/2001 | McDaniel |
| 6,329,681 | B1 | 12/2001 | Nakamura et al. |
| 6,335,282 | B1 | 1/2002 | Sharan et al. |
| 6,350,679 | B1 | 2/2002 | McDaniel |
| 6,437,417 | B1 | 8/2002 | Gilton |
| 6,453,914 | B2 | 9/2002 | Torek et al. |
| 6,465,828 | B2 | 10/2002 | Agarwal |
| 6,589,884 | B1 | 7/2003 | Torek |
| 6,703,306 | B2 | 3/2004 | Lee |
| 6,707,088 | B2 | 3/2004 | Fishburn |
| 6,709,983 | B2 | 3/2004 | Torek et al. |
| 6,740,593 | B2 | 5/2004 | Torek et al. |
| 6,783,695 | B1 | 8/2004 | Torek et al. |
| 6,784,501 | B2 | 8/2004 | Lane et al. |
| 6,794,238 | B2 | 9/2004 | Lane et al. |
| 7,445,996 | B2 * | 11/2008 | McDaniel ..................... 438/682 |

(Continued)

*Primary Examiner* — Zandra Smith
*Assistant Examiner* — Toniae Thomas
(74) *Attorney, Agent, or Firm* — TraskBritt

(57) ABSTRACT

Methods for forming memory devices and integrated circuitry, for example, DRAM (dynamic random access memory) circuitry, structures and devices resulting from such methods, and systems that incorporate the devices are provided.

16 Claims, 8 Drawing Sheets

(56) References Cited

U.S. PATENT DOCUMENTS

| | | |
|---|---|---|
| 2002/0042209 A1 | 4/2002 | Abe et al. |
| 2002/0045309 A1 | 4/2002 | Yoshida et al. |
| 2002/0047138 A1 | 4/2002 | Watanabe et al. |
| 2002/0068423 A1 | 6/2002 | Park et al. |
| 2002/0100924 A1 | 8/2002 | Rhodes |
| 2002/0132467 A1 | 9/2002 | Fischer et al. |
| 2002/0182847 A1 | 12/2002 | Yokoyama et al. |
| 2003/0022437 A1 | 1/2003 | Fishburn |
| 2003/0049903 A1 | 3/2003 | Mitani |
| 2003/0068879 A1 | 4/2003 | McDaniel et al. |
| 2003/0087499 A1 | 5/2003 | Lane et al. |
| 2003/0107074 A1 | 6/2003 | Chen |
| 2003/0183822 A1 | 10/2003 | Lane et al. |
| 2004/0046195 A1 | 3/2004 | Nakamura et al. |
| 2004/0102027 A1 | 5/2004 | Liao et al. |
| 2004/0121526 A1 | 6/2004 | Yamamoto |
| 2004/0121548 A1 | 6/2004 | Fishburn et al. |

* cited by examiner

METHODS OF FORMING CONDUCTIVE CONTACTS

CROSS-REFERENCE TO RELATED APPLICATIONS

The present application is a continuation of U.S. patent application Ser. No. 11/512,004, filed Aug. 29, 2006, now U.S. Pat. No. 8,026,542, issued Sep. 27, 2011, which is a divisional of U.S. patent application Ser. No. 10/932,327 filed Sep. 1, 2004, now U.S. Pat. No. 7,605,033, issued Oct. 20, 2009.

TECHNICAL FIELD

The invention relates generally to semiconductor processing methods of forming integrated circuitry including DRAM integrated circuitry, and, more particularly, to processes for forming a metal plug structure for contacting polysilicon plugs in a memory cell array and active areas including word lines and doped regions in a periphery area of a memory device.

BACKGROUND

A dynamic random access memory (DRAM) device is commonly used in electronic systems to store data. A typical DRAM device includes memory cells arranged in an array and a peripheral circuit around the memory cell array, with each memory cell generally consisting of a capacitor coupled through a transistor gate electrode or word line stack to a bit or digit line. The doped regions or active areas of a transistor fabricated in a semiconductive substrate are typically contacted using polysilicon (poly) plugs, which may connect with a capacitor, a bit line, or other conductor layers.

In the formation of local interconnects in memory devices, it is difficult to form low resistance peripheral contacts while maintaining high quality array contacts.

In a conventional process flow for fabricating a DRAM device, contact openings are formed through insulative layers in the DRAM peripheral area to active areas in the substrate and in the DRAM array area poly plugs are connected to diffusion regions, and filled with conductive material to form peripheral and array contacts. A problem faced in making a DRAM local interconnect contact is that there are subsequent temperature steps, which make it difficult to put down chemical vapor deposition (CVD) films early in the DRAM fabrication process flow. Although films such as physical vapor deposition (PVD) TiN can withstand high process temperatures, they are high in resistivity, making them undesirable for forming contacts on a silicon substrate.

CVD titanium (CVD Ti) provides a desirable film for fabricating a low resistivity resistance contact. However, problems such as delamination of subsequently deposited film layers that are formed over a CVD Ti layer can develop. In addition, a CVD Ti layer deposited onto amorphous silicon highly doped poly plugs exposed in the memory cell array results in the formation of titanium silicide ($TiSi_x$) in the poly plugs resulting in the development of voids within the plugs. Further, due to die shrinkage, there is a trend to fabricate DRAM word lines (gate stacks) of tungsten rather than tungsten silicide, due to the lower resistivity of tungsten. However, in utilizing titanium to form interconnects to the tungsten layer of a gate stack, it is difficult to selectively remove portions of the titanium layer to form the gate contacts without adversely affecting the exposed tungsten of the stack.

It would be desirable to provide a process that overcomes such problems.

DISCLOSURE

The present invention provides methods for forming memory devices and integrated circuitry, for example, DRAM circuitry, structures and devices resulting from such methods, and systems that incorporate the devices.

In one aspect, the invention provides methods for forming a memory device. In one embodiment, the method includes: providing a substrate having a memory cell array area and a peripheral circuitry area, the memory cell array including at least one word line with an adjacent source/drain region in a silicon substrate and a polysilicon plug over the source/drain region adjacent a gate stack, the peripheral circuitry including an active area in the silicon substrate, and a dielectric layer overlying the memory cell array area and the peripheral circuitry area; forming a first opening in the dielectric layer at the peripheral circuitry area to expose the active area in the silicon substrate, chemical vapor deposition of a titanium layer over the dielectric layer and into the first opening to form a titanium silicide layer over the silicon substrate; removing the titanium layer selective to the titanium silicide layer; forming a second opening in the dielectric layer at the memory cell array area to expose the polysilicon plug; and forming metal contacts within the first and second openings to the active area and the exposed polysilicon plug.

Preferably, the CVD titanium layer is selectively removed by applying a sulfuric acid solution onto the substrate, preferably containing at least about 50% sulfuric acid. It is also preferred that the metal contacts are formed by physical vapor deposition (PVD, sputtering) of titanium (Ti), which can be conducted in an atmosphere of nitrogen, to form a PVD Ti layer, which can incorporate nitrogen, followed by a metal nitride layer (e.g., tungsten nitride), and a conductive metal layer (e.g., tungsten). In another embodiment, the metal contacts can be formed by CVD of titanium to form a CVD Ti layer with nitrogen incorporated into the layer.

In another aspect, the invention provides processing methods for forming integrated circuitry. In one embodiment, the method includes forming memory circuitry and peripheral circuitry over a substrate, the memory circuitry comprising at least one word line with an adjacent source/drain region in a silicon substrate and a polysilicon plug over the source/drain region adjacent the gate stack, and the peripheral circuitry comprising an active area in the silicon substrate and an overlying dielectric layer (e.g., BPSG), depositing a second dielectric layer (e.g., TEOS oxide) over the first dielectric layer and the memory circuitry; forming a first opening in the first and second dielectric layers at the periphery circuitry area to expose the active area in the silicon substrate; chemical vapor deposition of a titanium layer over the second dielectric layer and into the first opening to form a titanium silicide layer over the silicon substrate; removing the titanium layer selective to the titanium silicide layer, preferably by the application of sulfuric acid ($H_2SO_4$); forming a second opening in the second dielectric layer at the memory cell array area to expose a polysilicon plug; and forming metal contacts within the first and second openings to the active area and the exposed polysilicon plug, preferably by physical vapor deposition of titanium (Ti), which can be conducted in an atmosphere of nitrogen, to form a PVD Ti layer over the second dielectric layer and into the first and second openings over the exposed polysilicon plug and the titanium silicide layer and sidewalls of the first and second openings. In another embodiment, the metal contacts can be formed by initially depositing a CVD Ti layer with nitrogen incorporated into the layer.

In another aspect of the invention, a method of forming a metallized contact to an active area in a silicon substrate in a periphery area and a metallized contact to a polysilicon substrate in a memory cell array area is provided. An embodiment of the method of forming the metallized contacts includes etching through an insulating layer to form a contact opening to expose the active area of the periphery area; chemical vapor deposition of a titanium layer over the substrate and into the first opening to form a titanium silicide layer over the silicon substrate; applying a sulfuric acid solution to the substrate to remove the titanium layer selective to the titanium silicide layer; etching through the insulating layer to form a bit line opening to expose a polysilicon plug in the memory cell array area; physical vapor deposition of titanium to form a PVD Ti layer (which can incorporate nitrogen) over the substrate into the contact opening over the titanium silicide layer and into the bit line opening over the exposed polysilicon plug, and over the sidewalls of the openings; and depositing a metal layer over the PVD Ti layer to form metallized contacts in the contact opening at the periphery area and the bit line opening at the memory cell array area.

A further aspect of the invention is directed to memory devices. In one embodiment, the memory device includes a memory cell array area comprising a word line with an adjacent source/drain region in a silicon substrate and a polysilicon plug over the source/drain region; a periphery area comprising an active area (e.g., source/drain region) in the silicon substrate; a first dielectric layer overlying the periphery area; a second dielectric layer overlying the first dielectric layer and the memory cell array area; and a bit line formed over the second dielectric layer and within a first opening through the second dielectric layer to a polysilicon plug in the memory cell array area, and within a second opening through the first and second dielectric layers to a titanium silicide layer over the active area in the periphery area; the bit line comprising a titanium layer, preferably deposited by PVD (which can be conducted in the presence of a nitrogen gas), overlying the polysilicon plug, the silicide layer, and sidewalls of the first and second openings, and a metal layer over the PVD Ti layer. In another embodiment of the memory device, the periphery area further includes a word line with a tungsten layer, and the bit line is formed within a third opening through the first and second dielectric layers to the tungsten layer of the word line.

In yet another aspect, the invention provides interconnects. One embodiment of an interconnect according to the invention comprises a titanium layer deposited by PVD, which can be conducted in the presence of nitrogen, overlying a dielectric layer, and overlying sidewalls and a polysilicon plug at a bottom of a bit line opening through the dielectric layer in a memory cell array area, and overlying sidewalls and a titanium silicide layer overlying an active area in a silicon substrate at a bottom of a contact opening through the dielectric layer in a periphery area. In another embodiment, the titanium layer of the interconnect is deposited by CVD in the presence of nitrogen.

A further aspect of the invention provides buried bit line memory circuitry. In one embodiment, the circuitry comprises a bit line over a dielectric layer and contacting a polysilicon plug in a memory cell array area and a titanium silicide layer overlying an active area in a silicon substrate in a periphery area, the bit line comprising a titanium layer deposited by physical vapor deposition (PVD Ti). In another embodiment, the bit line comprises a titanium layer deposited by CVD in the presence of nitrogen. The bit line can further comprise an overlying metal layer, for example, a metal nitride barrier layer and a conductive metal layer. In another embodiment, the bit line further contacts a tungsten layer of a word line in the periphery area.

In yet another aspect, the invention provides integrated circuitry, such as DRAM integrated circuitry. In one embodiment, the integrated circuit comprises a word line with an adjacent source/drain region in a silicon substrate and a polysilicon plug over the source/drain region adjacent the DRAM word line in a memory cell array area; a word line with an adjacent source/drain region in a silicon substrate in a periphery area; and a bit line formed over a dielectric layer overlying the memory cell array area and within a bit line opening through the dielectric layer to the polysilicon plug, and within first and second contact openings through the dielectric layer over the periphery area, the first contact opening to a titanium silicide layer over the active area and the second contact opening to a tungsten layer of the word line; the bit line comprising a titanium layer deposited by physical vapor deposition (PVD Ti), which can be conducted in an atmosphere of gaseous nitrogen, overlying the dielectric layer, the polysilicon plug, the silicide layer, and sidewalls of the first and second openings. In another embodiment, the bit line comprises a titanium layer deposited by CVD in the presence of nitrogen.

In a further aspect of the invention, electronic systems incorporating the integrated circuits are provided. In one embodiment, the system comprises a processor, and an integrated circuit (e.g., a memory circuit such as a DRAM memory circuit) in communication with the processor, the integrated circuit comprising a bit line over a dielectric layer and contacting a polysilicon plug in a memory cell array area and a titanium silicide layer overlying an active area in a silicon substrate in a periphery area, the bit line comprising a titanium layer deposited by physical vapor deposition (PVD Ti), which can be conducted in the presence of a nitrogen gas.

In another embodiment, the system comprises a microprocessor, and a memory device coupled to the microprocessor, the memory device including a memory cell array comprising a word line with an adjacent source/drain region in a silicon substrate and a polysilicon plug over the source/drain region adjacent the word line; a periphery area comprising an active area in the silicon substrate; a dielectric layer overlying the memory cell array and the periphery area; and a bit line formed over the silicon substrate and within a first opening through the dielectric layer to the polysilicon plug in the memory cell array area, and within a second opening through the dielectric layer to a silicide layer over the active area in the periphery area; the bit line comprising a PVD Ti layer, which can incorporate nitrogen, overlying the polysilicon plug, the silicide layer, and sidewalls of the first and second openings, and a metal layer over the PVD Ti layer. In another embodiment, the bit line can comprise a CVD Ti layer that includes nitrogen.

Advantageously, the invention provides a method for simultaneously forming low resistance peripheral contacts to active areas (e.g., source/drain regions) in the periphery of a memory device, and suitable contacts to highly doped polysilicon (poly) plugs in the memory array area, while eliminating problems such as voids and opens in the poly plugs, and delamination of subsequently deposited films caused by CVD deposited titanium layers and their related stresses. The contacts produced according to the invention also demonstrate improved temperature stability in later process steps.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals may be used throughout the several views and in the description to indicate same or like parts.

DETAILED DESCRIPTION

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the context of the current application, the terms "semiconductor substrate," "semiconductive substrate," "semiconductive wafer fragment," "wafer fragment," or "wafer," will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

The following description with reference to the figures provides an illustrative example in the fabrication of DRAM integrated circuitry (IC) construction. Such description is only for illustrative purposes and the present invention can be utilized to provide other integrated circuitry in other constructions and devices. The present invention is not limited to the described illustrative devices.

Steps in an embodiment of a method for fabricating local interconnect contacts according to an embodiment of the invention are illustrated in FIGS. 1 through 7. The illustrated example is of the fabrication of bit line contacts to a poly plug of a memory array and to active areas in a periphery area of a memory device.

Figure 1:
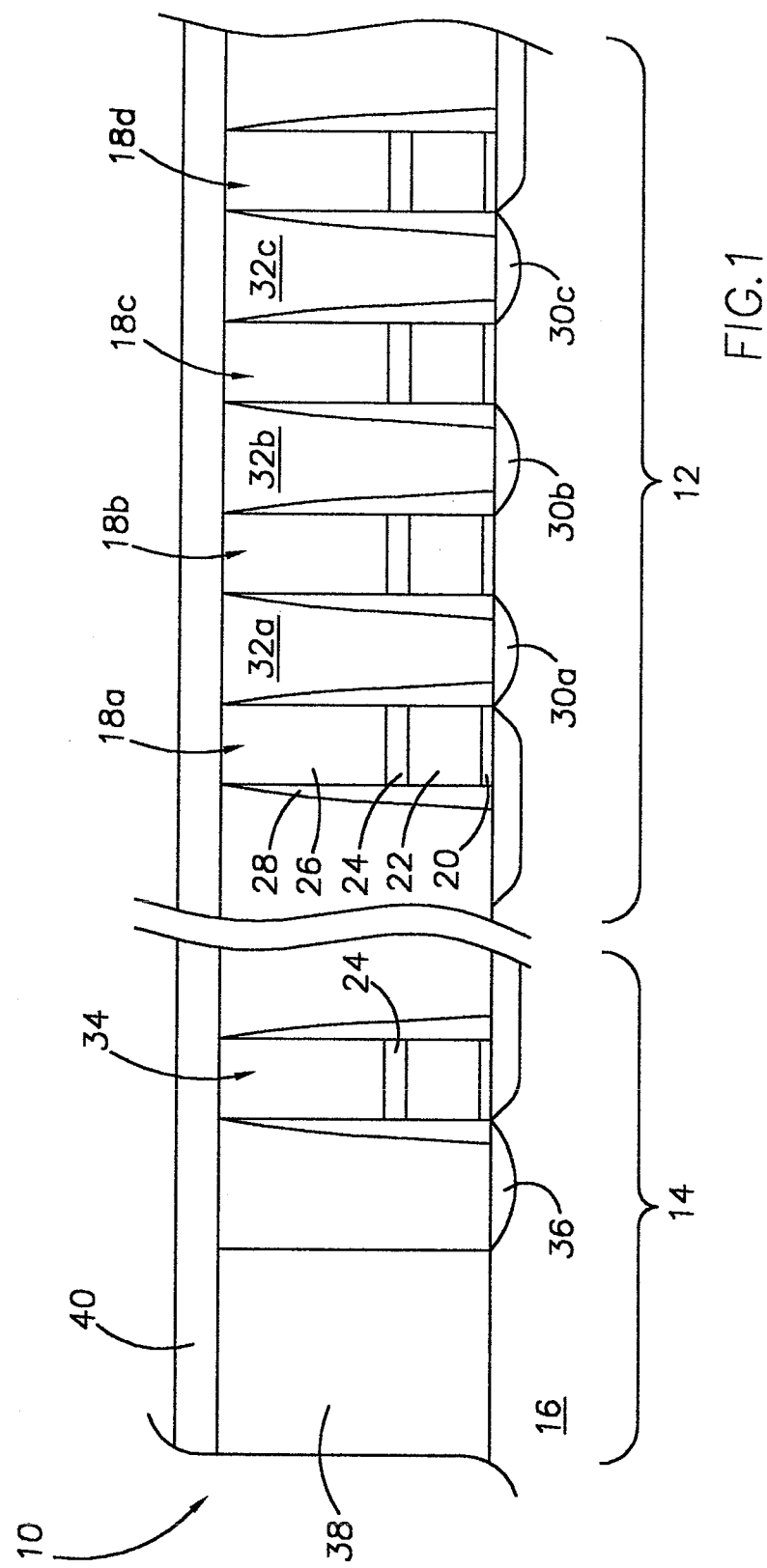
FIG. 1 is a diagrammatic, cross-sectional view of a semiconductor construction at a preliminary processing stage of an exemplary application of the present invention, showing a wafer fragment comprising example DRAM integrated circuitry in fabrication.

FIG. 1 depicts a wafer fragment 10 at a preliminary processing step. As shown, a DRAM memory cell array 12 and a DRAM peripheral logic circuitry (periphery) area 14 where control circuitry is formed outside of and around the memory cell array 12, have been fabricated on the substrate 16 of the wafer fragment 10.

The substrate 16 can comprise an unprocessed semiconductor wafer or other substrate, the wafer with various process layers formed thereon including one or more semiconductor layers or other formations, and active or operable portions of semiconductor devices. A semiconductor device can comprise a transistor, capacitor, electrode, insulator, or any of a variety of components commonly utilized in semiconductor structures. In the illustrated example, the substrate 16 comprises a semiconductive material such as monocrystalline silicon that is lightly doped with a conductivity enhancing material.

The memory cell array 12 includes a series of four word lines or gate stacks 18a-18d, which are conventional as shown and formed over the substrate 16. The word lines or gate stacks 18a-18d generally include a gate dielectric layer 20 over the substrate 16, an overlying conductive polycrystalline silicon (poly) layer 22, an overlying conductive metal (e.g., tungsten) or metal silicide layer 24, and an insulative cap 26 and sidewall spacers 28 (e.g., silicon nitride, SiN). Two memory cells (word lines) 18b, 18c electrically connect doped source/drain diffusion regions 30a, 30c and, as depicted, share a source/drain diffusion region 30b that will electrically connect with a bit (digit) line, as described herein. The memory cell array 12 further includes highly doped, polysilicon (poly) plugs 32a-32c. The poly plugs can be further identified as poly plugs 32a, 32c, which will connect with subsequently formed memory cell capacitors, and poly plug 32b, which will connect with a subsequently formed bit (digit) line.

The DRAM periphery area 14 comprises a tungsten gate stack or word line 34 (including tungsten layer 24) and an active area (source/drain region) 36 in the silicon substrate 16.

A first dielectric (insulative) layer 38 overlies the substrate 16, and can be, for example, silicon dioxide ($SiO_2$), silicon dioxide deposited by decomposition of tetraethylorthosilicate (TEOS oxide), phosphosilicate glass (PSG), borosilicate glass (BSG), borophosphosilicate glass (BPSG), a spin-on dielectric (SOD), or other dielectric material, in a single layer or multiple layers, with the first dielectric layer 38 being BPSG in the illustrated example. The first dielectric layer 38 can be deposited by chemical vapor deposition or other suitable technique.

Overlying the first dielectric layer 38 and the DRAM array 12 is a second dielectric (insulative) layer 40, which can be, for example, $SiO_2$, TEOS oxide, PSG, BSG, BPSG, SOD, and the like, being TEOS oxide in the present example. The second dielectric layer 40 is formed over the DRAM array 12 to insulate the poly plugs 32a-32c.

Figure 2:
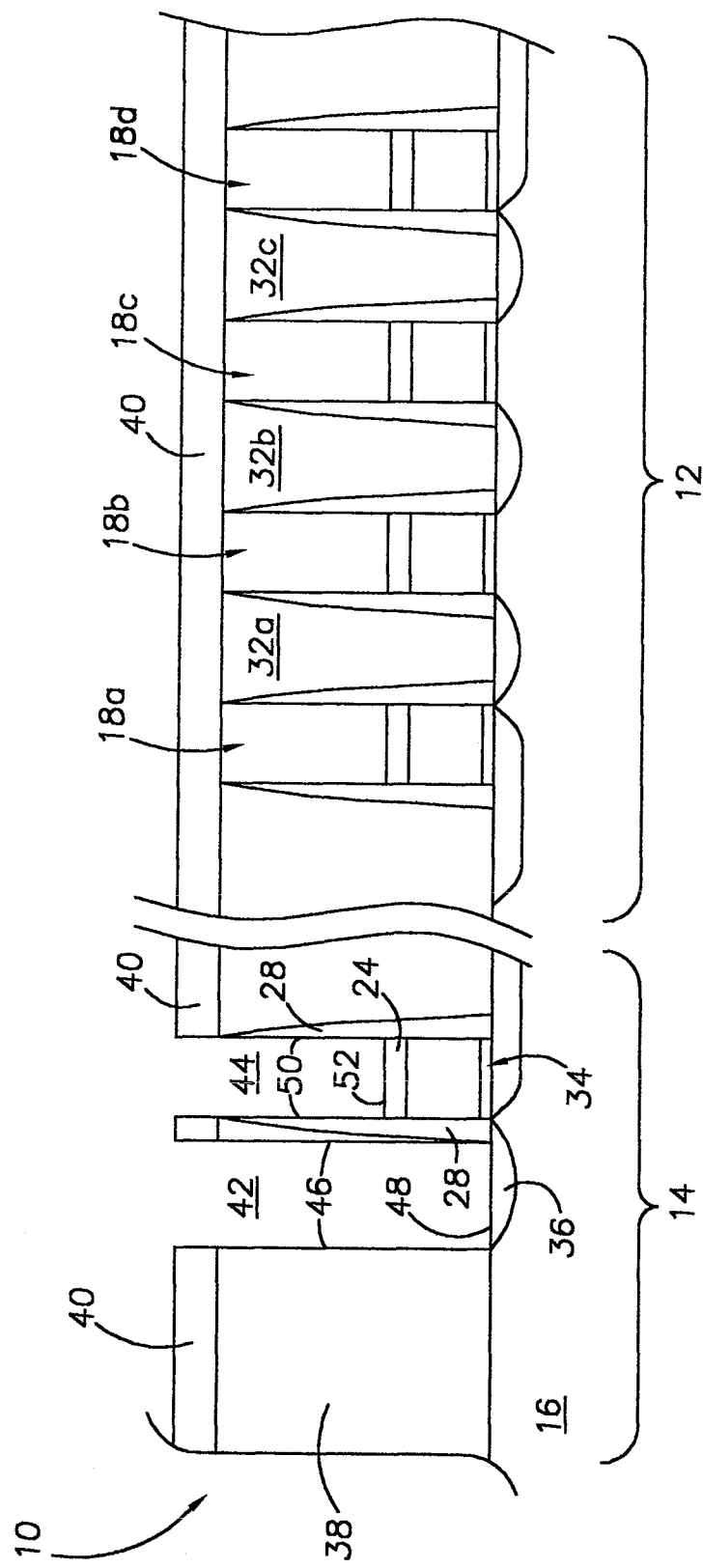
FIGS. 2 through 7 are views of the wafer fragment of FIG. 1 at sequential processing steps subsequent to that of FIG. 1 according to an embodiment of a method of the invention.

Referring now to FIG. 2, according to the present invention, with the second dielectric layer 40 insulating the poly plugs 32a-32c of the memory array 12, a directional dry etch (e.g., a reactive ion etch (RIE)) or other suitable process through a photomask (not shown) is conducted in the peripheral logic circuitry area 14 to etch through the dielectric layers 38, 40 to form respective peripheral contact or plug openings 42, 44, also referred to herein as source/drain (S/D) contact opening 42 and gate contact opening 44. As shown, the contact opening 42 extends to and exposes the active area (source/drain region) 36 in the silicon substrate 16, and gate contact opening 44 extends to the tungsten layer 24 of the gate stack (word line) 34. The source/drain (S/D) contact opening 42 has sidewalls 46 defined by the dielectric layers 38, 40, and a bottom or base 48 defined by the exposed surface of the silicon substrate 16 containing the source/drain (S/D) region 36. The gate contact opening 44 includes sidewalls 50 defined by the sidewall spacers 28 and the second dielectric layer 40, and a bottom or base 52 defined by the exposed surface of the tungsten layer 24 of the gate stack 34. After formation of the gate contact opening 44, the photoresist mask is removed.

Figure 3:
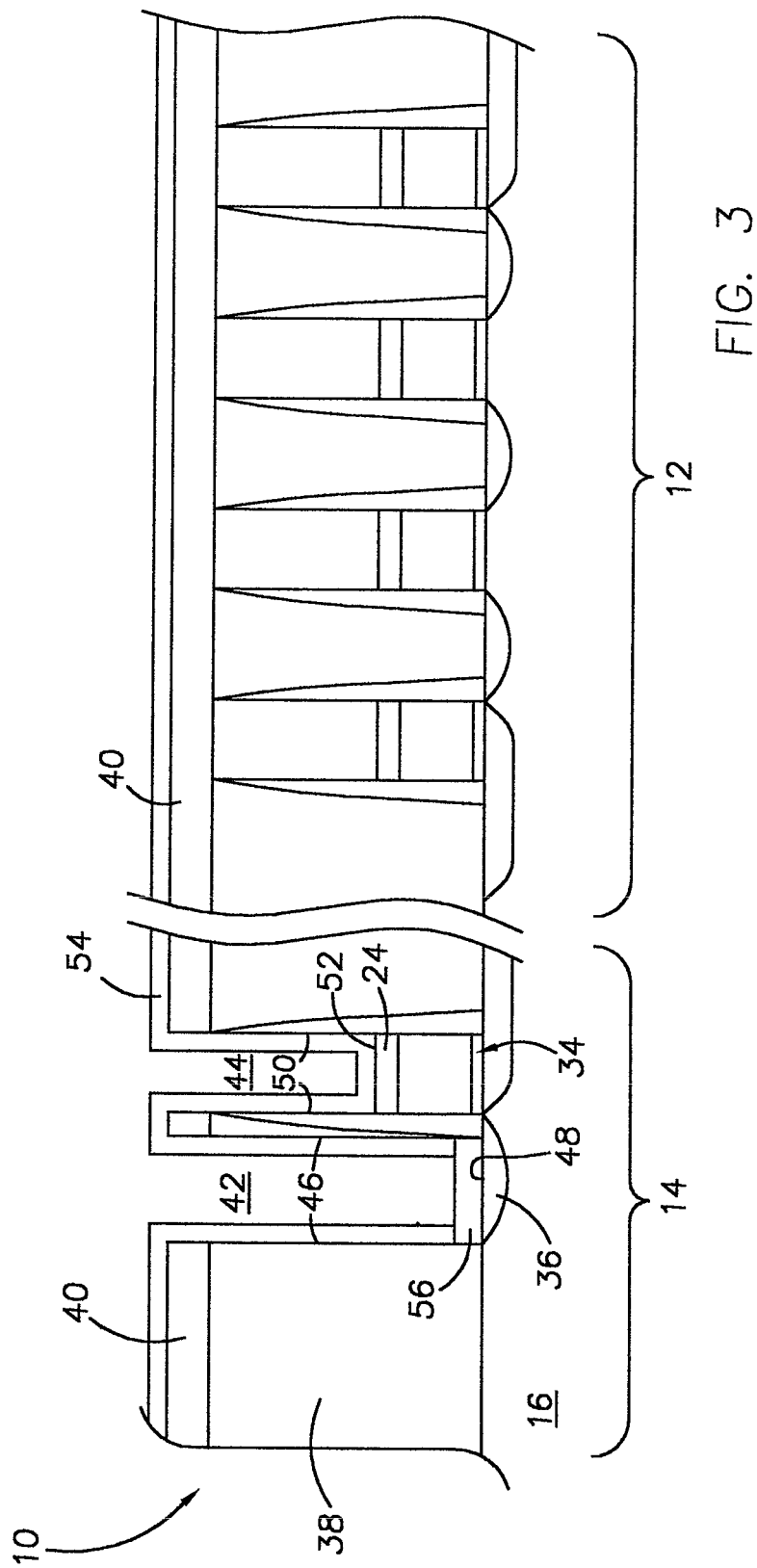

Referring to FIG. 3, a titanium (Ti) layer 54 is then formed by chemical vapor deposition (CVD) over the surface of the second dielectric layer 40 as well as over the sidewalls 46, 50 and bottom 48, 52 of the contact openings 42, 44. Typically, a sufficient thickness of the titanium layer 54 is about 1-1,000 Å. The titanium layer 54 can be deposited using a standard chemical vapor deposition (CVD) process. For example, a plasma enhanced chemical vapor deposition (PECVD) process can be conducted using a gas mixture comprised of $TiCl_4$, Ar, $H_2$, and He, a reaction gas temperature of about 650° C., an RF power of about 400 W, and a chamber pressure of about 4 Torr.

During the titanium CVD process, the titanium reacts with the exposed silicon substrate 16 and remains unreacted over the exposed dielectric layers 38, 40 and the exposed tungsten layer 24 of the periphery gate stack 34. The reaction of the titanium with the silicon substrate 16 at the bottom 48 of the S/D contact opening 42 results in the formation of a film of titanium silicide ($TiSi_x$) 56 at the interface between the CVD titanium layer 54 and the doped polysilicon substrate 16. The silicide layer 56 enhances conductivity of a subsequently formed S/D contact within the opening 42 by providing a low resistivity conductive film between the silicon substrate 16 and the overlying contact.

Figure 4:
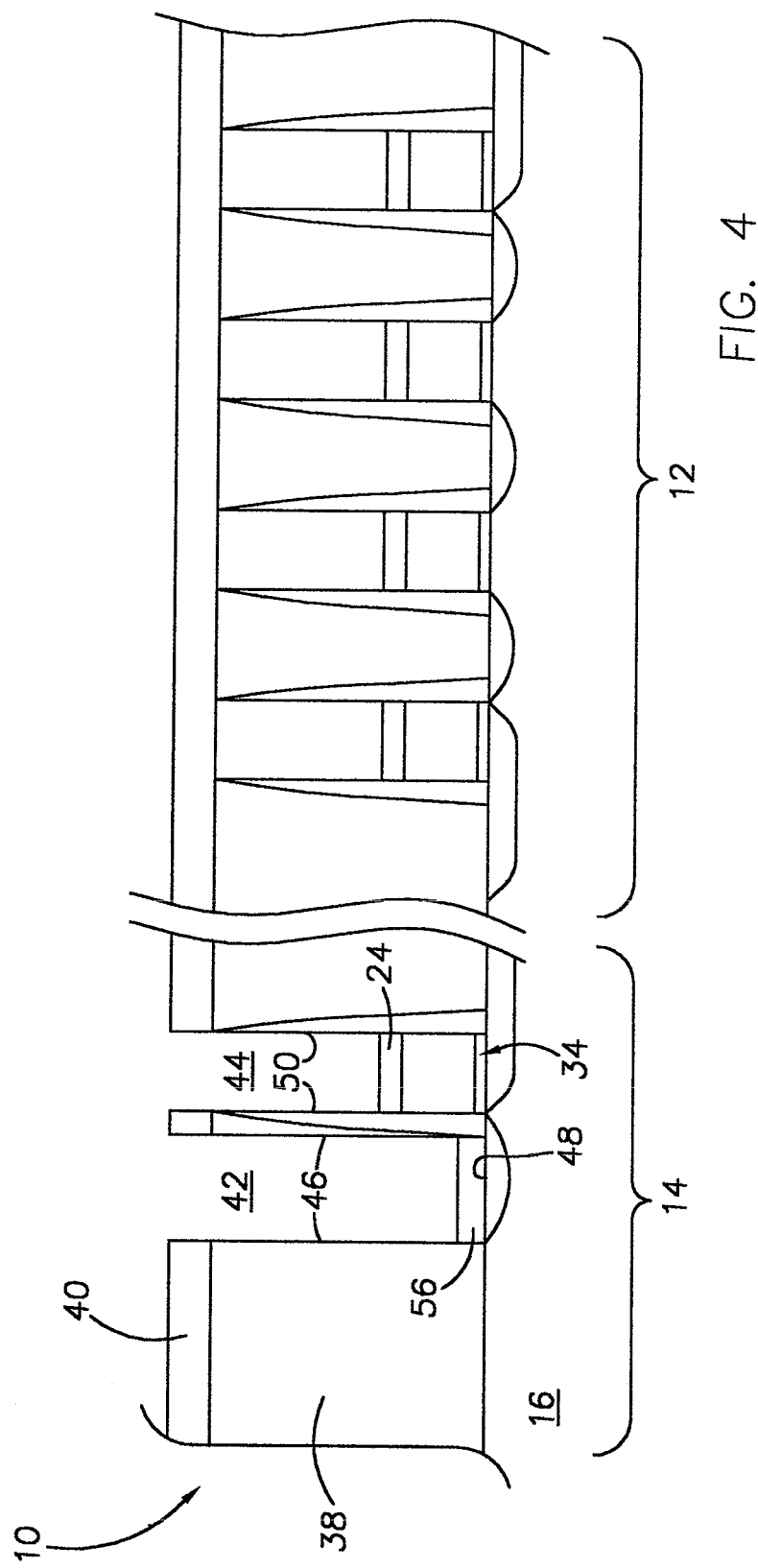

To eliminate problems such as the delamination of subsequently formed layers over a chemical vapor deposition titanium (CVD Ti) base layer, the unreacted titanium layer 54 is then stripped by a selective wet etch, resulting in the structure depicted in FIG. 4. Sulfuric acid ($H_2SO_4$) is applied to selectively remove the unreacted titanium layer 54 without detrimentally removing the titanium silicide ($TiSi_x$) layer 56 over the silicon substrate 16 at the bottom 48 of the S/D contact opening 42, or other exposed materials such as dielectric materials (i.e., dielectric layers 38, 40) or the tungsten layer 24 of the periphery gate stack (word line) 34, which is exposed within the gate contact opening 44. The unreacted titanium (Ti) layer 54 overlying the sidewalls 46, 50 of the contact openings 42, 44, the tungsten (W) layer 24 in the gate contact opening 44, and over the surface of the second insulative layer 40, is removed selective to the $TiSi_x$ layer 56 at the bottom 48 of the S/D contact opening 42 and the W layer 24 of the gate stack 34 (i.e., with minimal removal of the $TiSi_x$ layer 56 or the W layer 24, and maximal removal of the Ti layer 54).

The sulfuric acid ($H_2SO_4$) solution can be applied over a range of concentrations, preferably, from an about 50 wt % to 100 wt % concentration (or 50% to 100% $H_2SO_4$). Sulfuric acid is commercially available in a number of different concentrations including 78 wt %, 93 wt %, 96 wt %, 98 wt % to 99 wt %, and 100 wt %.

To selectively wet etch the unreacted titanium layer 54, the wafer fragment 10 can be immersed in or sprayed with the sulfuric acid solution, exposed to vapors of the sulfuric acid solution, and the like. Processing time is generally a few seconds to an hour or longer, and can vary according to the concentration and the temperature of the sulfuric acid solution, and the thickness of the titanium layer 54. Preferably, the sulfuric acid is heated to a temperature of about 100° C. to 140° C., preferably about 120° C. As an example, wafer fragment 10 bearing an about 85 Å titanium layer 54 can be immersed in an about 98% sulfuric acid solution at about 120° C. for about 5 to 10 minutes to remove the unreacted titanium layer 54.

Figure 5:
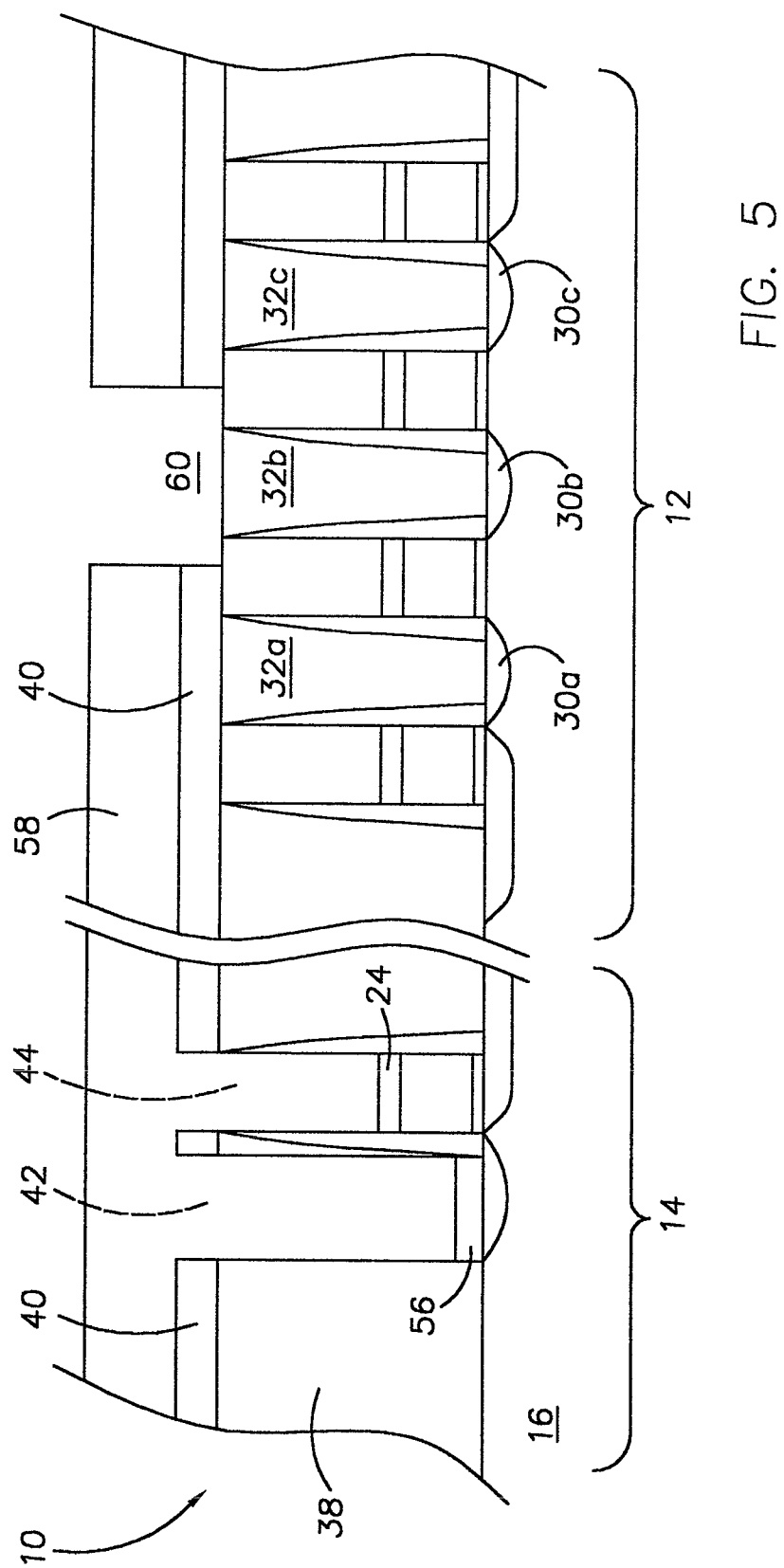

Referring now to FIG. 5, after the removal of the unreacted titanium layer 54, a photoresist mask 58 is deposited onto the second dielectric layer 40 and patterned, and a directional etching process (e.g., RIE) or other suitable process is used to etch through the second dielectric layer 40 to define a bit (digit) line opening 60 to the poly plug 32b of the memory array 12. After formation of the bit line opening 60, the photoresist mask 58 is removed.

Figure 6:
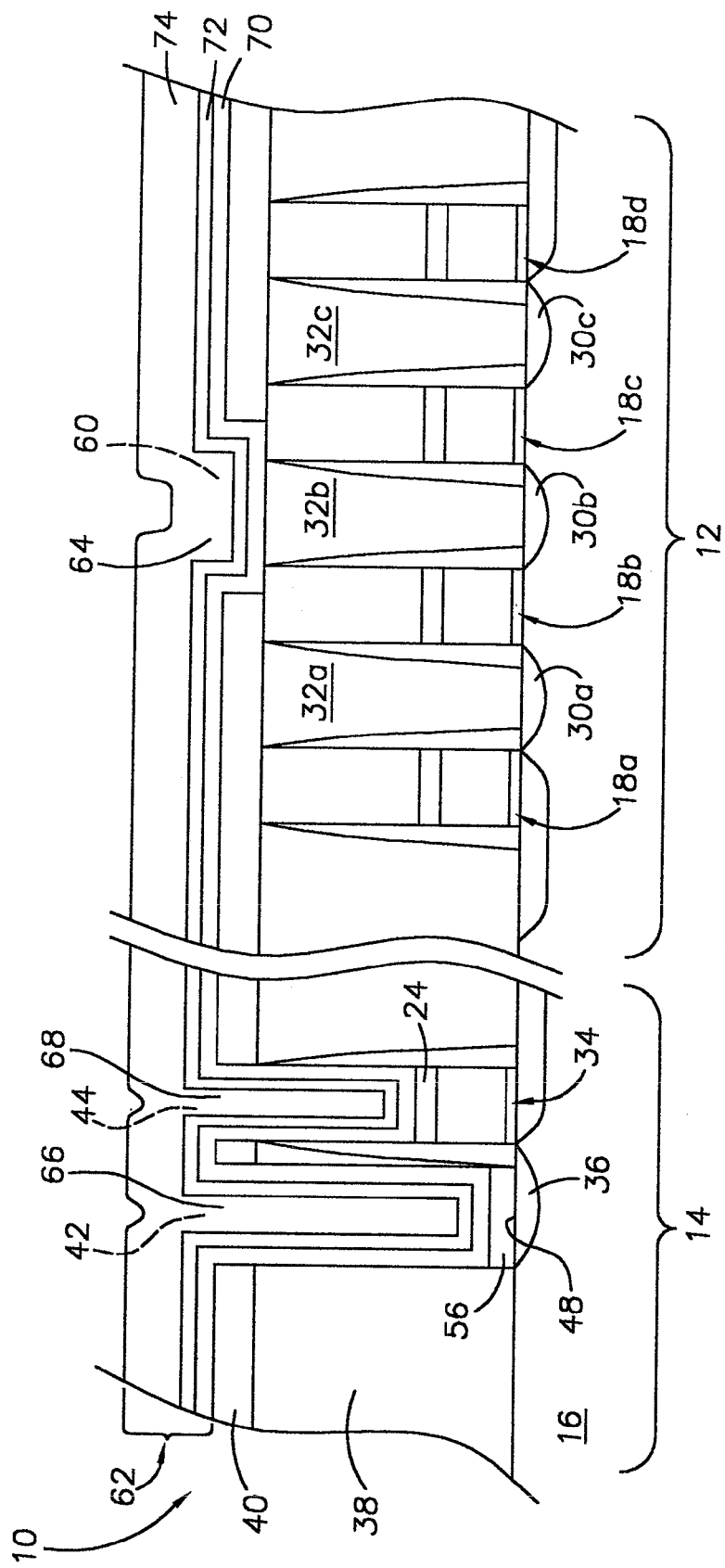

As illustrated in FIG. 6, the buried bit (digit) line material layer 62 is now deposited over the surface and to simultaneously fill the bit line opening 60 and the peripheral contact openings 42, 44. The results in the formation of a bit line contact 64 that is electrically coupled to the poly plug 32b and the shared source/drain diffusion region 30b of the memory array 12 and, in the DRAM periphery area 14, peripheral contacts (plugs) 66, 68 to the source/drain (S/D) region 36 and to the tungsten (W) layer 24 of the gate stack 34, respectively.

An exemplary conductive (bit line) material layer 62 is formed by depositing, in sequence, a conductive barrier layer 70 to prevent migration of an overlying conductive metal (e.g., tungsten layer) into the poly plug 32b, a second conductive barrier layer 72, and a conductive metal layer 74. In a preferred embodiment, the conductive barrier layer 70 comprises titanium formed by a physical vapor deposition (PVD Ti) process involving reactive sputtering from a titanium target as known and used in the art, which can be conducted in an atmosphere of gaseous nitrogen ($N_2$) to include nitrogen in the PVD Ti layer. Exemplary PVD process conditions for sputtering titanium include a deposition temperature of about 200° C., an inductive coil power (RF) of about 2.8 kW, a target power (DC) of about 2.5 kW, a pressure of about 10 to 20 mTorr, with argon (Ar) and nitrogen ($N_2$) flows at 0-1,000 sccm and 0-1,000 sccm, respectively. The resulting PVD Ti layer 70 is deposited over the surface and the sidewalls and base of the contact openings 42, 44, 60. A preferred thickness for the PVD Ti layer 70 is about 1-1,000 Å. In another embodiment, a titanium layer 70 can be deposited by a chemical vapor deposition (CVD) process as known and used in the art, preferably in the presence of a nitrogen source to form a CVD Ti layer.

An overlying tungsten nitride (WN) layer 72 can be deposited onto the titanium layer 70 (e.g., PVD Ti layer) by a standard PVD process. A tungsten (W) layer 74 can then be deposited over the surface of the WN layer 72 and to fill the contact openings 42, 44, 60 by a conventional chemical vapor deposition (CVD) process. The resulting conductive (bit line) material layer 62 comprises a three-layer stack of (PVD) titanium/tungsten nitride/tungsten (PVD Ti/WN/W).

Advantageously, the PVD Ti layer 70 has a greater tolerance to high process temperatures than CVD Ti. In addition, sputtering titanium (Ti) to produce the PVD Ti layer 70 deposits a reduced amount of Ti onto the surface compared to a CVD Ti layer resulting in very little titanium silicide ($TiSi_x$) in the highly doped, poly plug 32b, thus eliminating the problem of void formation within the poly plug. Although a PVD Ti layer has a higher resistance on a silicon substrate (12) than a CVD Ti layer, since the PVD Ti layer 70 is deposited onto a low resistance $TiSi_x$ layer 56 in the bottom of the S/D contact opening 42 and does not directly contact the silicon substrate 16, the contact resistance is low.

Figure 7:
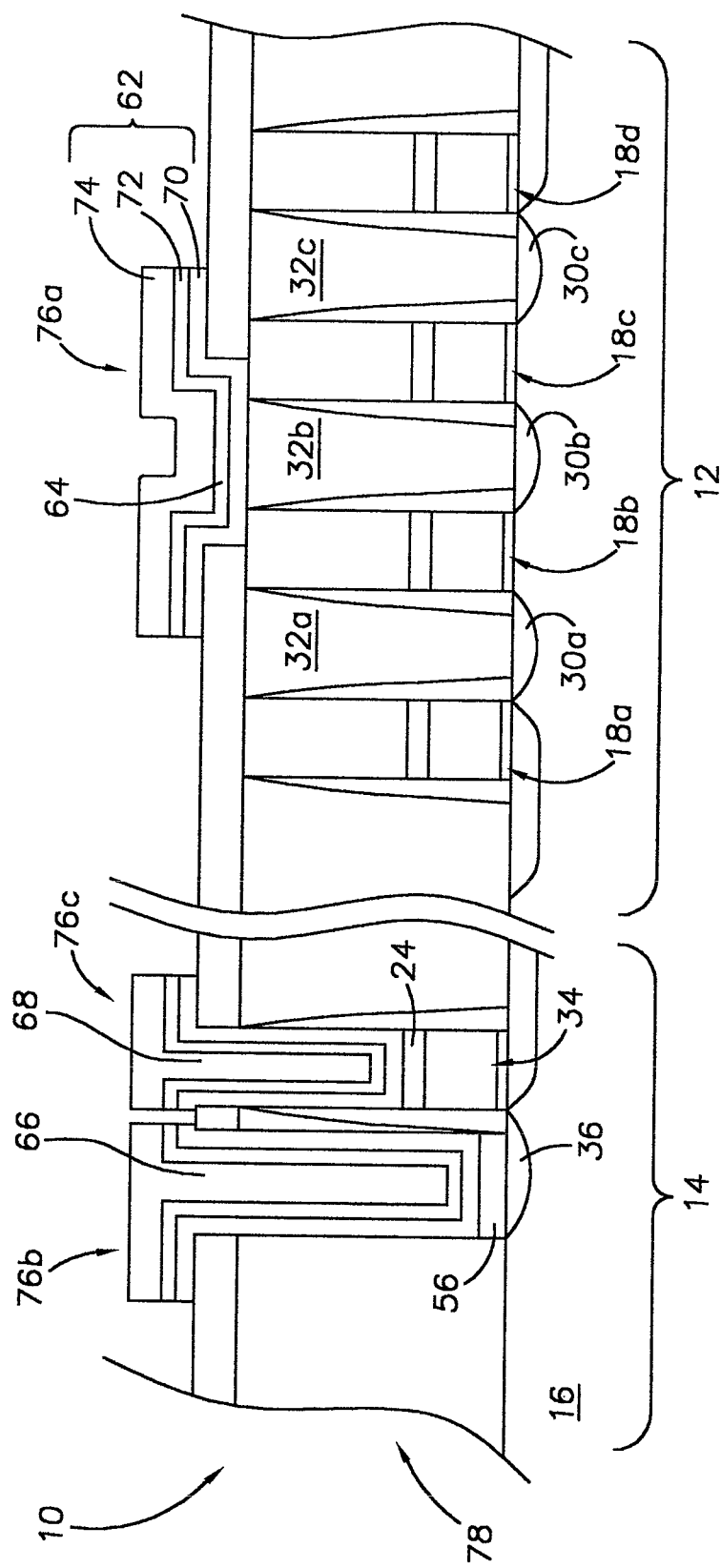

As illustrated in FIG. 7, the deposited conductive (bit line) material layer 62 is then patterned and etched by a standard process to form buried bit (digit) lines 76a-76c.

The resulting semiconductor structure 78 includes a buried bit (digit) line 76a and a high quality and reliable bit (digit) line contact 64 to the highly doped, polysilicon (poly) plug 32b without causing voids or opens in the poly plug 32b as with a CVD Ti layer. The structure also includes, in the periphery area 14, a buried bit (digit) line 76b and a low resistance contact 66 to the active area S/D region 36 in the polysilicon substrate 16 with the $TiSi_x$ layer 56 in the bottom of the contact, and a buried bit (digit) line 76c and gate contact 68 to the tungsten (W) layer 24 of the gate stack 34.

Although conductive materials such as CVD Ti make low resistance contacts on a silicon substrate (16), they will void out highly doped poly plugs 32b due to the formation of $TiSi_x$ in the plugs. In the present invention, the formation of the low resistance TiSi$_x$ layer 56 over the slightly doped silicon substrate 16 in the peripheral contact opening 42, enables a conductive material such as Ti, which provides a good contact and will not void out the highly doped poly plugs but has a high resistance on the silicon substrate 16, to be successfully deposited as a PVD Ti layer 70 in forming both the bit line contact 64 to the poly plug 32*b* and the peripheral contact 66 to the S/D region 36 in the silicon substrate 16.

The resulting semiconductor structure 78 can be used in a variety of applications including, for example, programmable memory devices, programmable resistor and capacitor devices, optical devices, and sensors, among others.

Figure 8:
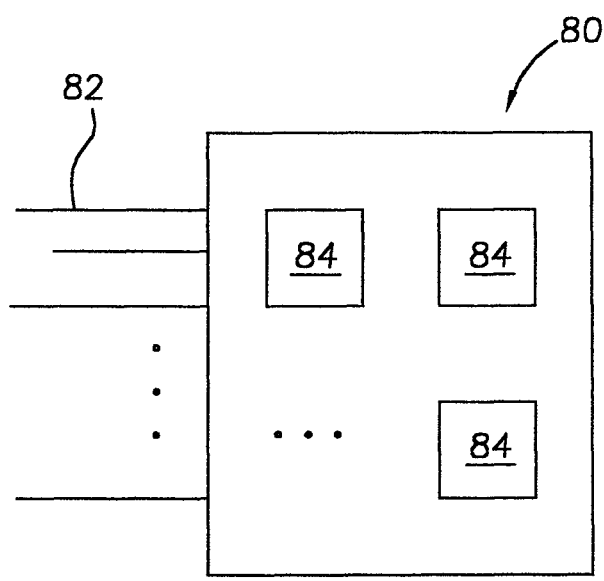
FIG. 8 is a block diagram of a circuit module according to an embodiment of the present invention.

FIG. 8 is a block diagram of an embodiment of a circuit module 80 in which the present invention can be incorporated. Such modules, devices and systems (e.g., processor systems) incorporating the module are described and illustrated in U.S. Pat. Nos. 6,437,417 (Gilton) and 6,465,828 (Agarwal), the disclosures of which are incorporated by reference herein. In brief, two or more dies may be combined into a circuit module 80 to enhance or extend the functionality of an individual die. Circuit module 80 may be a combination of dies representing a variety of functions, or a combination of dies containing the same functionality. One or more dies of the circuit module 80 can contain circuitry, or integrated circuit devices, that includes at least one contact in accordance with the embodiments of the present invention. The integrated circuit devices can include a memory device that comprises a semiconductor structure as discussed in the various embodiments in accordance with the invention.

Some examples of a circuit module include memory modules, device drivers (on a BIOS or EPROM), power modules, communication modems, processor modules, and application-specific modules, and may include multilayer, multichip modules. Circuit module 80 may be a subcomponent of a variety of electronic systems, such as a clock, a television, a cell phone, a personal computer, an automobile, an industrial control system, an aircraft, among others. Circuit module 80 will have a variety of leads 82 extending therefrom and coupled to dies 84 providing unilateral or bilateral communication and control.

The circuit module 80 can be incorporated, for example, into an electronic system that comprises a user interface, for example, a keyboard, a monitor, a display, a printer, and speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent, and, optionally, user interface components, and other associated components such as modems, device interface cards, etc. Examples of memory circuits include, but are not limited to, DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact, comprising:
   forming titanium silicide over an active area in a silicon substrate at a base of a first opening in an insulative material;
   forming titanium over the insulative material, over and in contact with the titanium silicide within the first opening, and over and in contact with a polysilicon contact at a base of a second opening in the insulative material;
   forming a metal nitride over the titanium; and
   forming a conductive metal over the metal nitride.

2. The method of claim 1, wherein forming the titanium silicide comprises forming titanium over the insulative material overlying the polysilicon contact without exposing the polysilicon contact.

3. The method of claim 1, further comprising forming the second opening in the insulative material to expose the polysilicon contact after forming the titanium silicide.

4. The method of claim 1, wherein forming the titanium silicide comprises forming the titanium silicide by chemical vapor deposition (CVD) of a titanium material onto the silicon substrate.

5. The method of claim 4, further comprising removing the titanium material from sidewalls of the first opening and from a surface of the insulative material after the chemical vapor deposition.

6. The method of claim 1, wherein forming the titanium comprises forming the titanium by physical vapor deposition (PVD) of a titanium material.

7. The method of claim 1, wherein forming the titanium comprises depositing the titanium in the presence of a nitrogen source.

8. The method of claim 1, wherein forming titanium silicide over an active area in a silicon substrate comprises:
   forming a titanium material over the insulative material and the active area; and
   reacting a portion of the titanium material over the active area with silicon to form titanium silicide while depositing the titanium material over the insulative material.

9. A method of forming a conductive contact, comprising:
   forming titanium silicide over an active area in a silicon substrate at a base of a first opening in an insulative material;
   forming a second opening in the insulative material to expose a polysilicon contact after forming the titanium silicide over the active area; and
   forming a metal over the insulative material and over and in contact with the titanium silicide and the polysilicon contact.

10. A method of forming a conductive contact, comprising:
   forming titanium silicide over an active area in a silicon substrate at a base of a first opening in an insulative material;
   depositing titanium by physical vapor deposition over the insulative material, over and in contact with the titanium silicide within the first opening, over and in contact with a polysilicon plug within a second opening in the insulative material, and in contact with sidewalls of the first and second openings;
   forming a metal nitride over the titanium; and
   forming a conductive metal over the metal nitride and within the first and second openings.

11. The method of claim 10, wherein forming the titanium silicide comprises forming titanium over the insulative material overlying the polysilicon contact without exposing the polysilicon contact.

12. The method of claim 10, further comprising forming the second opening in the insulative material to expose the polysilicon contact after forming the titanium silicide.

13. A method of forming a conductive contact, comprising:
forming a titanium material over an insulative material and within a first opening within the insulative material to form titanium silicide over and in contact with a silicon material at a base of the first opening;
removing the titanium material selective to the titanium silicide;
forming a second opening in the insulative material to expose a polysilicon contact;
forming titanium over the insulative material and over and in contact with the titanium silicide within the first opening and over and in contact with the polysilicon contact within the second opening;
forming a metal nitride over the titanium; and
forming a conductive metal over the metal nitride.

14. A method of forming a conductive contact, comprising:
forming titanium over an insulative material and within a first opening within the insulative material to form titanium silicide over and in contact with a silicon material at a base of the first opening;
removing the titanium selective to the titanium silicide;
forming a second opening in the insulative material to expose a polysilicon contact;
forming additional titanium over the insulative material, over and in contact with the titanium silicide within the first opening, and over and in contact with the polysilicon contact within the second opening;
forming a metal nitride over the titanium; and
forming a conductive metal over the metal nitride.

15. A method of forming a conductive contact, comprising:
forming a titanium material over an insulative material and within first and second openings within the insulative material to form titanium silicide over and in contact with a silicon material at a base of the first opening and to form titanium over and in contact with a tungsten material at a base of the second opening;
removing the titanium selective to the titanium silicide and the tungsten material;
forming a third opening in the insulative material to expose a polysilicon material; and
forming a metal over the insulative material and over and in contact with the titanium silicide within the first opening, the tungsten material within the second opening, and the polysilicon material within the third opening.

16. The method of claim 15, wherein forming the metal comprises:
forming another titanium material over the insulative material, the titanium silicide, the tungsten material, and the polysilicon material;
forming a metal nitride over the another titanium material; and
forming a conductive metal over the metal nitride.

* * * * *